United States Patent [19]

Wang

[11] Patent Number: 5,061,779
[45] Date of Patent: Oct. 29, 1991

[54] LIQUID EPOXY POLYMER COMPOSITION AND USE THEREOF BASED ON CYCLOALIPHATIC AMINE CURED DIFUNCTIONAL/POLYFUNCTIONAL RESIN BLENDS

[75] Inventor: David W. Wang, Vestal, N.Y.

[73] Assignee: International Business Machines Corporation, Armonk, N.Y.

[21] Appl. No.: 322,847

[22] Filed: Mar. 14, 1989

[51] Int. Cl.$^5$ .............................. C08G 59/32
[52] U.S. Cl. ................................ 528/98; 528/97; 528/103; 525/482; 525/484; 523/466
[58] Field of Search .............. 528/97, 98; 525/482, 525/484; 523/466

[56] References Cited

U.S. PATENT DOCUMENTS

| | | | |
|---|---|---|---|
| 2,915,490 | 1/1959 | Hopper et al. | 528/98 |
| 3,268,619 | 8/1966 | Nametz | 525/482 |
| 3,523,037 | 8/1970 | Chellis | 117/119.6 |
| 3,787,451 | 1/1974 | Mah | 528/98 |
| 4,177,174 | 12/1979 | Hayashi et al. | 260/18 |
| 4,309,473 | 1/1982 | Minamisawa et al. | 428/292 |
| 4,394,496 | 1/1983 | Schrader | 428/98 |
| 4,481,349 | 11/1984 | Marten et al. | 528/120 |
| 4,552,814 | 11/1985 | Cavitt et al. | 428/414 |
| 4,680,341 | 7/1987 | Newman-Evans | 525/113 |

OTHER PUBLICATIONS

Interez-Eip-Rez ® 510 Epoxy Resin.
Celanese-Polymer Specialities Company-Competitive Resin Guid.
Epon ® Resin Chemistry, p. 9.
Epon ®/Eponol Resins Epon ® Curing Agents.
Epoxy Resin HB 3337-An Epoxy Phenol Novolac Resin for Coatings.
EPN 1138 and EPN 1139 Epoxy Phenol Novolac Resins for Coatings.
Tactix Performance Polymers-Tactix 742.
Material Safety Data Sheet-Dow Chemical-Tactix 742 Performance Polymer.
Dow Chemical Company Quality Assurance Sales Specification Product Code 04514-Tactix H31 Performance Hardener.
Dow Chemical Company Quality Assurance Sales Specification Product Code 04515-Tactix H41 Performance Polymer.
Interez-Epi-Cure ® 826, Curing Agent.
Celanese Specialty Resins-Monoepoxide Diluents for Epoxy Resin Systems.

Primary Examiner—John Kight, III
Assistant Examiner—Frederick Krass
Attorney, Agent, or Firm—Pollock, Vande Sande & Priddy

[57] ABSTRACT

A liquid epoxy composition containing a diglycidyl ether of a dihydric phenol and/or a diglycidyl ether of a tetrabrominated dihydric phenol, an epoxy with a functionality from 2.2 to 4, cycloaliphatic diamine curing agent, and thixotropic agent; and use thereof to fill drilled through-holes in circuit boards and cards and as isolation border around the edges of a board or card.

21 Claims, No Drawings

LIQUID EPOXY POLYMER COMPOSITION AND USE THEREOF BASED ON CYCLOALIPHATIC AMINE CURED DIFUNCTIONAL/POLYFUNCTIONAL RESIN BLENDS

TECHNICAL FIELD

The present invention is concerned with liquid epoxy polymer compositions that are suitable for filling drilled through-holes in circuit boards and circuit cards. In particular, the compositions of the present invention possess a unique combination of elevated glass transition temperature (Tg) values, increased shelf-life and gel times, and flow characteristics for effective and efficient filling of drilled through-holes in circuit boards and circuit cards.

In addition, the present invention is concerned with the use of the compositions for filling drilled through-holes in circuit boards and cards and also for providing an isolation border at the edge of a board or card.

BACKGROUND ART

In the manufacture of printed circuit cards and boards, a dielectric sheet material is employed as the substrate. A conductive circuit pattern is provided on one or both of the major surfaces of the substrate. In order to provide electrical connection between layers, metal coated through-holes are provided. Notwithstanding the improvements over the years in processing sometimes defective plated through-holes are produced, including insufficient coating or discontinuities in the coating in the through-holes. In order to avoid discarding the entire board or card in the event of a defective plated through-hole, the hole is reworked and refilled in order to prepare the board or card for subsequent rewiring to compensate for the defective hole. Certain epoxy compositions have been used for this purpose. Although epoxy compositions used for this purpose have been adequate, the glass transition temperatures of such compositions are not especially high, such as about 50°-60° C. With the increase in potential operating temperatures to which the boards or cards are likely to experience in the future, the stability of the rework hole fill could be adversely effected in view of the relatively low glass transition of the epoxy composition employed.

SUMMARY OF INVENTION

The present invention overcomes the deficiencies of prior epoxy compositions used for refilling drilled through-holes by making it possible to achieve relatively high glass transition temperatures while, at the same time, possessing good gel time and shelf-life. In particular, the compositions of the present invention have glass transition temperatures of at least about 75° C. and cure at about 105° C. or less. The compositions of the present invention contain:

A) a diglycidyl ether of a dihydric phenol epoxide or diglycidyl ether of a tetrabrominated dihydric phenol, or mixtures thereof;
B) epoxy having epoxide functionality of 2.2 to 4; and
C) an amount sufficient for curing of a cycloaliphatic diamine.

The weight ratio of A to B employed must be about 2:1 to about 8:1.

In addition, the compositions of the present invention can include up to about 10% by weight of a thixotropic agent.

The present invention is also concerned with a method for filling drilled through-holes in circuit boards or cards. This method includes filling the drilled through-hole with the above-disclosed composition and then curing the composition by subjecting it to elevated temperatures of about 65° C. to about 105° C. for a time sufficient to cure the composition.

The present invention is also concerned with circuit board or card containing as the isolation border the above-disclosed composition.

Best and Various Modes for Carrying out Invention

The composition of the present invention contains a diglycidyl ether of a dihydric phenol and/or diglycidyl ether of a tetrabrominated dihydric phenol These poly-epoxides employed usually have epoxide equivalent weights of about 180 to about 400 and preferably about 185 to about 280.

The diglycidyl ethers of dihydric phenols are known and commercially available. For instance, such are polyepoxides of halo epoxy alkane and a polynuclear dihydric phenol. The preferred polyepoxides of this class being the polyepoxides of epichlorohydrin and bisphenol A, i.e., 2,2-bis(p-hydroxyphenyl)propane.

The halo-epoxy alkane can be represented by the formula:

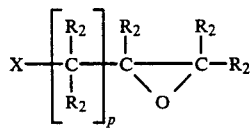

wherein X is a halogen atom (e.g., chlorine, bromine, and the like), p is an integer from 1-8, each $R_2$ individually is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxypentane, 2-chloromethyl-1,2-epoxybutane, 1-bromo-4-methyl-3,4-epoxypentane, 1-bromo-4-ethyl-2,3-epoxypentane, 4-chloro-2-methyl-2,3epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

Examples of polynuclear dihydric phenols are those having the formula:

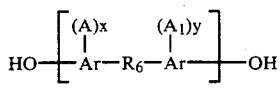

wherein Ar is an aromatic divalent hydrocarbon such as naphthylene and, preferably, phenylene; A and $A_1$ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and $R_6$ is a bond between adjacent carbon atoms as in dihydroxydiphenyl or is a divalent radical including, for example:

$$-\underset{\underset{O}{\|}}{C}-,\ -O-,\ -S-,\ -SO-,\ -SO_2-,\ \text{and}\ -S-S-$$

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2'-bis-(4-hydroxyphenyl)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1'-bis-(4-hydroxyphenyl)ethane, 1,2'-bis-(4-hydroxyphenyl)ethane, 1,1'-bis-(4-hydroxy-2-chlorphenyl)ethane, 1,1'-bis(3-methyl-4-hydroxyphenyl) ethane, 1,3'-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis(2-isopropyl-4-hydroxyphenyl)pentane, 2,2'-bis-(4-hydroxyphenyl) heptane, bis-(4-hydroxyphenyl)phenylmethane, bis-(4-hydroxyphenyl)cyclohexylmethane, 1,2'-bis-(4-hydroxyphenyl)-1,2'-bis-(phenyl)propane and 2,2'-bis-(4-hydroxyphenyl)-1-phenyl-propane; di(hydroxyphenyl) sulfones such as bis-(4-hydroxyphenyl)sulfone, 2,4'-dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl) ether, bis-(4-hydroxy-3-bromophenyl)ether, bis-(4-hydroxynaphthyl)ether, bis-(4-hydroxy-3-chloronaphthyl) ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

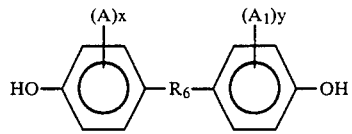

wherein A and $A_1$ are as previously defined, x and y have values from 0 to 4 inclusive and $R_6$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2'-bis(p-hydroxyphenyl)propane.

The brominated epoxy polymers (i.e., diglycidyl ether of a tetrabrominated bis-phenol) are known and commercially available.

Such can be obtained by reacting a brominated bisphenol such as tetrabrominated bisphenol A with a halo-epoxy alkane. The halo-epoxy alkane can be represented by the formula:

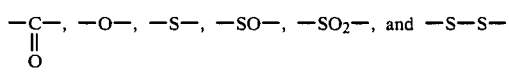

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group totals no more than 10 carbon atoms. The preferred haloepoxy alkane is epichlorohydrin.

The preferred brominated epoxy polymers have an epoxy equivalent of about 200 to about 400.

Of course, mixtures of any of the above polyepoxides can be employed, if desired.

Typical commercially available diglycidyl ether polyepoxides suitable for use in the present invention are Epon 828, Epon 830, and Epon 834, available from Shell Chemical Company; Epi-Rez 510, available from Hi-Tek Polymers, Inc.; and Araldite GY 506, which is a diglycidyl ether of bisphenol A modified with butyl glycidyl ether, available from Ciba-Geigy Corporation.

The diglycidyl ether polyepoxide is normally present in the composition in amounts of about 45% to about 80% by weight and preferably about 60% to about 80% by weight.

The compositions of the present invention also must include an epoxy having an epoxide functionality of about 2.2 to about 4. Suitable epoxides having such functionality include the epoxidized novolacs and Tactix 742, available from Dow Chemical.

Tactix 742 is a semisolid epoxy which can be represented by the following structural formula:

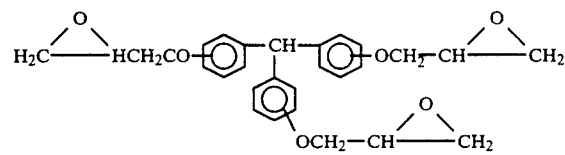

The epoxidized novolac can be represented by the formula:

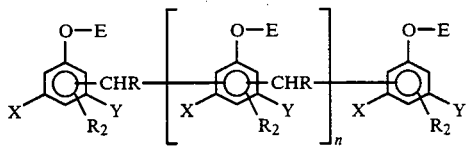

wherein n is at least about 0.2; E is hydrogen or an epoxyalkyl group, on the average at least 2.2 E groups per polymer molecule being an epoxyalkyl group and wherein the epoxyalkyl group is represented by the formula:

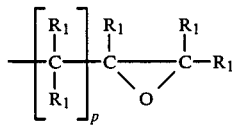

p is an integer from 1-8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxyalkyl group totals no more than 10 carbon atoms; each X and Y is individually hydrogen or chlorine or alkyl or hydroxy; each $R_2$ individually is hydrogen or chlorine or a hydrocarbon group such as alkyl, aryl, aralkyl, alkaryl, and cycloalkyl.

The epoxy novolacs can be prepared by known methods by the reaction of an uncross-linked phenolic-aldehyde polymer of a phenol having the formula:

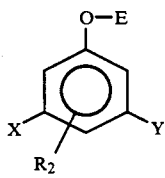

(wherein X, Y, and $R_2$ have the meanings as defined above) with a halo-epoxy alkane of the formula:

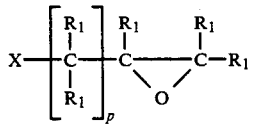

wherein X is a halogen atom (e.g., chlorine, bromine, and the like) and p and $R_1$ have the same meanings as defined hereinabove.

Hydrocarbon-substituted phenols having two available positions ortho or para to a phenolic hydroxy group for aldehyde condensation to provide polymers suitable for the preparation of epoxy novolacs include o- and p-cresols, o- and p-ethyl phenols, o- and p-isopropyl phenols, o- and —-tert-butyl phenols, o- and p-sec-butyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenyl, o- and p-phenethyl phenols, o- and p-phenyl phenols, o- and p-tolyl phenols, o- and p- cyclopentyl phenols, 4-phenethyl resorcinol, 4-tolyl resorcinol, 4-cyclohexyl resorcinol.

Various chloro-substituted phenols which can also be used in the preparation of phenol-aldehyde resins suitable for the preparation of the epoxy novolacs include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methylphenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,4-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

As condensing agents any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes such as toluic aldehyde, naphthaldehyde, furfuraldehyde, glyoxal, acrolein, or compounds capable of engendering aldehydes such as paraformaldehyde, hexamethylene tetramine. The aldehydes can also be used in the form of a solution such as the commercially available formalin.

While glycidyl ethers such as derived from epichlorohydrin are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl 2,3-epoxy-propane, 1-bromo-2,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

The preferred epoxidized novolac employed according to the present invention is represented by the formula:

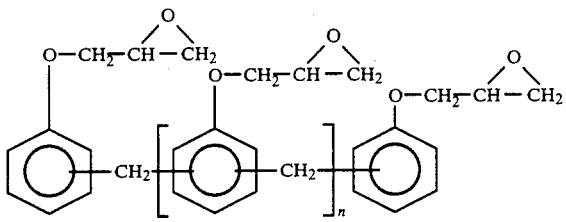

wherein n is at least about 0.2. The epoxidized novolac can be a liquid or semisolid, depending upon its molecular weight.

Epoxy polymers wherein the epoxide functionality is about 2.2 to about 3 are preferred; a typical example being Aratronic 5057 from Ciba-Geigy which has an epoxy functionality of 2.4.

Those epoxides having an epoxide functionality of about 2.2 to about 4 are usually present in the compositions in amounts of about 10% to about 20% by weight. The weight ratio of the diglycidyl epoxy to the epoxy with functionality of about 2.2 to about 4 employed is about 2:1 to about 8:1, preferably about 2.4:1 to 7:1, and most preferably about 5:1 to 7:1. The compositions of the present invention also include at least one polyamine curing agent, especially primary polyamines and most preferably cycloaliphatic diamines. Such polyamine curing agents are commercially available and include diaminocyclohexane. For instance, Tactix H31 is available from the Dow Chemical Company and is a mixture containing 80-90% by weight of diaminocyclohexane and, according to the manufacturer, along with the following:

1,6 hexamethylenediamine, maximum 10% by weight
2-methyl-1,5-pentadiamine, maximum 20% by weight
water, maximum 0.3% by weight hexamethyleneimine, maximum 0.1% by weight low basis, maximum 0.5% by weight.

Typical properties of Tactix H31 are:
color alpha, maximum 100 (ASTM D1209)
flash point (PMCC) 161° F (ASTM D93)
density 0.940 grams/cc (ASTM D941)
boiling point 371° F (ASTM D850).

Another suitable commercially available polyamine curing agent is Epi-Cure 826 from Hi-Tek Polymers, Inc. which, according to the manufacturer, is a low viscosity aliphatic amine adduct.

The polyamine curing agent is usually present in the composition in amounts of about 5% to about 20% by weight and preferably about 7% to about 15% by weight.

The compositions of the present invention can also contain up to about 10% by weight, and preferably about 0.5% to about 10% by weight, and most preferably about 0.5% to about 5% by weight of a thixotropic or thickening agent, preferably fumed or colloidal silica.

Colloidal silica is silica having a surface area of about 50 to about 500M-2/gram (determined by the BET nitrogen adsorption material) with particles having diameters from about 5 millimicrons to about 20 millimicrons. Colloidal silica, used according to the present invention, is preferably fused silica gel or fused silicon dioxide, as it is sometimes called. In addition, the colloidal silica is often referred to in the art as silica aerogel. Fused silica is obtained by the hydrolysis or combustion of silicon tetrachloride in hydrogen-oxygen furnaces. Examples of some commercially available colloidal silicas include Cab-O-Sil® and Santocel®. Carbon black and bentonite clay are other examples of thixotropic agents that may be used.

It may be desirable to include a reactive diluent in the composition to obtain a viscosity that is especially suitable for applying the compositions. The amount of diluent is useful to obtain the composition with desired glass transition temperature and is selected for obtaining the desired viscosity for filling of drilled through-holes.

The reactive diluent when employed is usually present in amounts of about up to about 15% by weight and preferably about 6% to about 12.5% by weight. Suitable reactive diluents are monoepoxides and include butyl glycidyl ether (Epi-Rez 501 from Hi-Tek Polymers, Inc.); p-tert butyl phenyl glycidyl ether (Epi-Rez 5014 from Hi-Tek Polymers, Inc.); o-cresyl glycidyl ether (Epi-Rez 5011 from Hi-Tek Polymers, Inc.); and $C_{12}$–$C_{14}$ aliphatic glycidyl ether (Epi-Rez 5018 from Hi-Tek Polymers, Inc.).

The compositions of the present invention must exhibit glass transition temperatures of at least about 75° C. and cure at about 105° C. or less. Preferably, the composition should be at least substantially cured (e.g., 90% cure) at about 85° C. to about 95° C. in about 2 hours or less and preferably in about 1 hour or less. In addition, use of the compositions for filling drilled through-hole requires that the compositions be clear for visual inspection.

Also, the compositions of the present invention have gel times of at least about 45 minutes at room temperature after mixing. This makes it possible to de-gas the liquid compositions of the present invention and freeze such for low temperature storage. Also, the compositions exhibit desired flow characteristics for filling of drilled through-holes.

The following non-limiting examples are presented to further illustrate the present invention:

EXAMPLE 1

Preparation of Composition

About 37.8 grams of a bisphenol A-epichlorohydrin polyepoxide having an epoxide equivalent weight of about 230–280 (Epon 834 from Shell); about 7.22 grams of a bisphenol A-epichlorohydrin polyepoxide having an epoxide equivalent weight of about 190–198 (Epon 830 from Shell); about 7.5 grams of an epoxidized phenolformaldehyde novolac having an epoxy functionality of 2.4 (Aratronic 5057 from Ciba-Geigy) and represented by the formula:

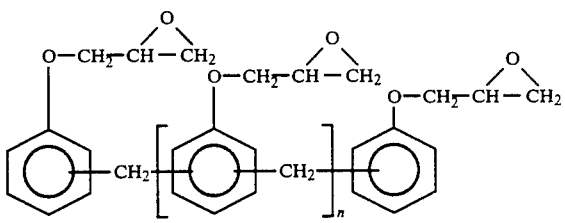

about 5 grams of butyl glycidyl ether (Epi-Rez 501 from Hi-Tek Polymers, Inc.); and 0.43 grams of fumed silica (Cab-O-Sil) are blended in a 250 ml. beaker at room temperature. After being de-gassed under vacuum, about 7.5 grams of diaminocyclohexane composition (Tactix H31 from Dow Chemical Company) are added to the mixture with vigorous stirring.

The resulting liquid resin is de-gassed under vacuum for three minutes and then poured into small syringes. The syringes are packaged and immediately frozen in liquid nitrogen These samples are stored at −40° C. in a freezer before use.

Test Sample Preparation

The frozen samples are allowed to warm up to room temperature in 10 minutes. The resin composition is dispensed in glass molds and cured at 85° C. for 2 hours or 95° C. for 1 hour. One day/85° C. post-baked samples are also included in the evaluation.

Glass Transition Temperature

Glass transition temperatures are determined using neat resin composition castings (1/16" thick). Each sample is scanned twice from −35° C. to 200° C. at a rate of 20° per minute in a Perkin-Elmer DSC7 differential scanning calorimeter. Onset glass transition temperature is determined for each material at each cure. The results of resin composition glass transition temperature (°C.) are listed as follows:

| 85° C./2 hours | 95° C./1 hour | 85° C./1 day |
|---|---|---|
| 77/83 (1st scan/rescan) | 72/76 | 98/102 |

EXAMPLE 2

A composition containing about 7 parts by weight of a bisphenol A-epichlorohydrin polyepoxide (Araldite GY 506), about 1 part by weight of an epoxidized phenolformaldehyde novolac having an epoxy functionality of 2.4 (Aratronic 5057 (from Ciba-Geigy), and about 1.1 parts by weight of diaminocyclohexane composition (Tactix H31 from Dow Chemical Company) is obtained.

The glass transition temperature is as follows:

| 85° C./1 hour | 85° C./2 hours |
|---|---|
| 56/83 (1st scan/rescan) | 74/83 |

EXAMPLE 3

A composition containing about 6 parts by weight of a bisphenol A-epichlorohydrin polyepoxide having an epoxide equivalent weight of about 185–192 (Epi-Rez 510 from Hi-Tek Polymers, Inc.); about 1.5 parts by weight of a trifunctional polyepoxide (Tactix 742); and about 2.40 parts by weight of an aliphatic amine adduct (Epi-Cure 826) is obtained. The composition has a glass transition temperature at 85° C/1 hour cure of 78/81 (1st scan/rescan).

Having thus described my invention, what I claim as new and desire to secure by Letters Patent is:

1. A liquid composition containing:
   A) about 45% to about 80% by weight of a diglycidyl ether of a dihydric phenol or diglycidyl ether of a tetrabrominated dihydric phenol or mixtures thereof;
   B) about 10% to about 20% of an epoxide having an epoxide functionality of about 2.2 to about 4; and wherein the weight ratio of A:B is about 2:1 to about 8:1;
   C) a cycloaliphatic polyamine curing agent in an amount sufficient for curing of the composition; and
   D) 0% to about 10% by weight of a thixotropic agent, wherein the above amounts are based upon the total amount of A, B, C, and D in the composition.

2. The composition of claim 1 wherein the amount of A is about 60% to about 80% by weight and the ratio of A:B is about 2.4:1 to 7:1.

3. The composition of claim 2 wherein the ratio of A:B is about 5:1 to about 7:1.

4. The composition of claim 1 wherein A is a bisphenol A-epichlorohydrin polymer having an epoxide equivalent weight of about 180 to about 400.

5. The composition of claim 4 wherein said epoxide equivalent weight is about 185 to about 280.

6. The composition of claim 1 having a glass transition temperature of at least about 75° C. and capable of being cured at about 95° C. in 2 hours or less.

7. The composition of claim 1 wherein B is an epoxidized novolac.

8. The composition of claim 1 wherein B has an epoxy functionality of about 2.2 to about 3.

9. The composition of claim 1 wherein said polyamine is a primary cycloaliphatic diamine.

10. The composition of claim 1 wherein said polyamine is diaminocyclohexane.

11. The composition of claim 1 wherein said polyamine is present in amounts of about 7% to about 15% by weight.

12. The composition of claim 1 wherein said thixotropic agent is present in amounts of about 0.5% to about 10% by weight.

13. The composition of claim 1 wherein said thixotropic agent is present in amounts of about 0.5% to about 5% by weight.

14. The composition of claim 1 wherein said thixotropic agent is colloidal silica.

15. The composition of claim 1 which further includes a reactive diluent.

16. The composition of claim 15 wherein said reactive diluent is a monoepoxide.

17. The composition of claim 16 wherein said reactive diluent is butyl glycidyl ether or p-tert butyl phenyl glycidyl ether.

18. The composition of claim 16 wherein the reactive diluent is present in amounts of about up to about 15% by weight.

19. The composition of claim 16 wherein the reactive diluent is present in amounts of about 6% to about 12.5% by weight.

20. The composition of claim 4 wherein B is a liquid or semi-solid epoxidized novolac from phenol and formaldehyde as the polyfunctional epoxy resin.

21. A liquid composition consisting essentially of
   A) about 45% to about 80% by weight of a diglycidyl ether of a dihydric phenol or diglycidyl ether of a tetrabrominated dihydric phenol or mixtures thereof having an epoxide equivalent weight of about 185 to about 280;
   B) about 10% to about 20% of a liquid or semi-solid epoxidized novolac having an epoxide functionality of about 2.2 to about 4; and wherein the weight ratio of A:B is about 2:1 to about 8:1;
   C) a cycloaliphatic polyamine curing agent in an amount sufficient for curing of the composition;
   D) about 0.5% to about 10% by weight of a thixotropic agent;
   E) up to about 15% by weight of a reactive diluent; wherein the above amounts are based upon the total amount of A, B, C, D, and E in the composition.

* * * * *